(12) United States Patent
Huang

(10) Patent No.: US 7,352,183 B2
(45) Date of Patent: Apr. 1, 2008

(54) METHOD AND APPARATUS FOR LOCALLY SHIELDING MR SUPERCONDUCTING MAGNET COIL

(75) Inventor: Xianrui Huang, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 44 days.

(21) Appl. No.: 11/425,860

(22) Filed: Jun. 22, 2006

(65) Prior Publication Data

US 2007/0296414 A1    Dec. 27, 2007

(51) Int. Cl.
*G01V 3/00* (2006.01)

(52) U.S. Cl. ................................. 324/318; 324/319

(58) Field of Classification Search ................ 324/318, 324/319, 320, 321
See application file for complete search history.

(56) References Cited

U.S. PATENT DOCUMENTS

| | | | |
|---|---|---|---|
| 5,289,128 A * | 2/1994 | DeMeester et al. | ......... 324/318 |
| 5,539,367 A * | 7/1996 | Xu et al. | ..................... 335/301 |
| 5,597,423 A * | 1/1997 | Book et al. | ................... 148/98 |
| 6,783,059 B2 | 8/2004 | Laskaris et al. | |

* cited by examiner

*Primary Examiner*—Louis M. Arana
(74) *Attorney, Agent, or Firm*—Scott J. Asmus; Patrick K. Patnode

(57) ABSTRACT

A method and apparatus for local grading shielding includes a gradient shield loop having a plurality of arcs positioned adjacent to a superconducting magnet coil. The plurality of arcs magnetically couple with a gradient magnetic field generated by a magnetic field gradient to locally shield the superconducting magnet coil.

27 Claims, 9 Drawing Sheets

METHOD AND APPARATUS FOR LOCALLY SHIELDING MR SUPERCONDUCTING MAGNET COIL

BACKGROUND OF THE INVENTION

The invention relates generally to superconducting magnet systems and more particularly to local gradient shielding loops for a superconducting magnet.

In one example, an MR system includes a cold mass that comprises a superconducting magnet, a magnet coil support structure, and a helium vessel. Liquid helium contained in the helium vessel provides cooling for the superconducting magnet and maintains the superconducting magnet at a low temperature for superconducting operations, as will be understood by those skilled in the art. The liquid helium maintains the superconducting magnet approximately and/or substantially at the liquid helium temperature of 4.2 Kelvin (K). For thermal isolation, the helium vessel that contains the liquid helium in one example comprises a pressure vessel inside a vacuum vessel.

An MR superconducting magnet typically includes several coils, a set of primary coils that produce a uniform $B_0$ field at the imaging volume, and a set of bucking coils that limit the fringe field of the magnet. These coils are wound with superconductors such as NbTi or Nb3Sn conductors. The magnet is cooled down to liquid helium temperature (4.2 K) so that the conductors are operated at their superconducting state. The heat loads of the magnet, such as that produced by the radiation and conduction from the environment, are removed by either the boil-off of liquid helium in an "open system" or by a 4 K cryocooler in a "closed system". The magnet is typically placed in a cryostat to minimize its heat loads since the replacement of liquid helium is expensive and since the cooling power of a cryocooler is limited. If the coils are exposed to an AC field, such as an AC field generated by gradient coils of the MR system, AC losses are generated in the superconductors. That is, when superconducting coils are exposed to an AC field, hysteresis loss and eddy currents are induced therein that contribute to AC losses, which can raise the conductor temperatures and potentially cause a quench. The AC losses also add to the total heat load for the refrigeration system. A rise in heat load requires additional cryogenic refrigeration power, which increases operating costs.

Penetration of gradient AC fields into the superconducting magnet should be minimized so that the total heat load of the superconducting magnet can be removed by the refrigeration system. At the same time, the field shielding effects should be very small in the image volume, otherwise the performance of the gradient system is significantly compromised. Use of large volume shield gradients to reduce gradient AC field penetration into the superconducting magnet has a large negative impact on the gradient system performance.

It would therefore be desirable to have an apparatus configured to reduce AC losses caused by gradient AC field penetration into the superconducting magnet with minimal impact on the gradient performance in the imaging volume.

BRIEF DESCRIPTION OF THE INVENTION

The present invention provides a method and apparatus for reducing penetration of gradient AC fields into the superconducting magnet that overcome the aforementioned drawbacks. A superconducting wire is positioned along portions of a superconducting magnet coil of an MR system. The superconducting wire couples with a gradient magnetic field and locally shields the superconducting magnet coil.

In accordance with one aspect of the invention, a shielding coil apparatus includes a superconducting wire forming a closed conductive path and having a plurality of arcs positioned along portions of a first superconducting magnet coil of an MR system, the plurality of arcs configured to magnetically couple with a gradient magnetic field generated by a magnetic field gradient of a first direction to locally shield the first superconducting magnet coil.

In accordance with another aspect of the invention, an MRI apparatus includes a magnetic resonance imaging system having a plurality of gradient coils positioned about a bore of a superconducting magnet to impress a polarizing magnetic field and an RF transceiver system and an RF switch controlled by a pulse module to transmit RF signals to an RF coil assembly to acquire MR images, wherein the superconducting magnet comprises a plurality of superconducting magnet coils. The MRI apparatus also includes a first gradient shielding loop routed proximate to each superconducting magnet coil and configured to couple with a magnetic field gradient, the magnetic field gradient comprising one of a $G_x$ magnetic field gradient, a $G_y$ magnetic field gradient, and a $G_z$ magnetic field gradient.

In accordance with yet another aspect of the invention, a method includes forming a superconducting magnet coil and routing a first plurality of arc portions of a first gradient shield coil adjacent to the coil, the first plurality of arc portions configured to couple with a first magnetic field gradient.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
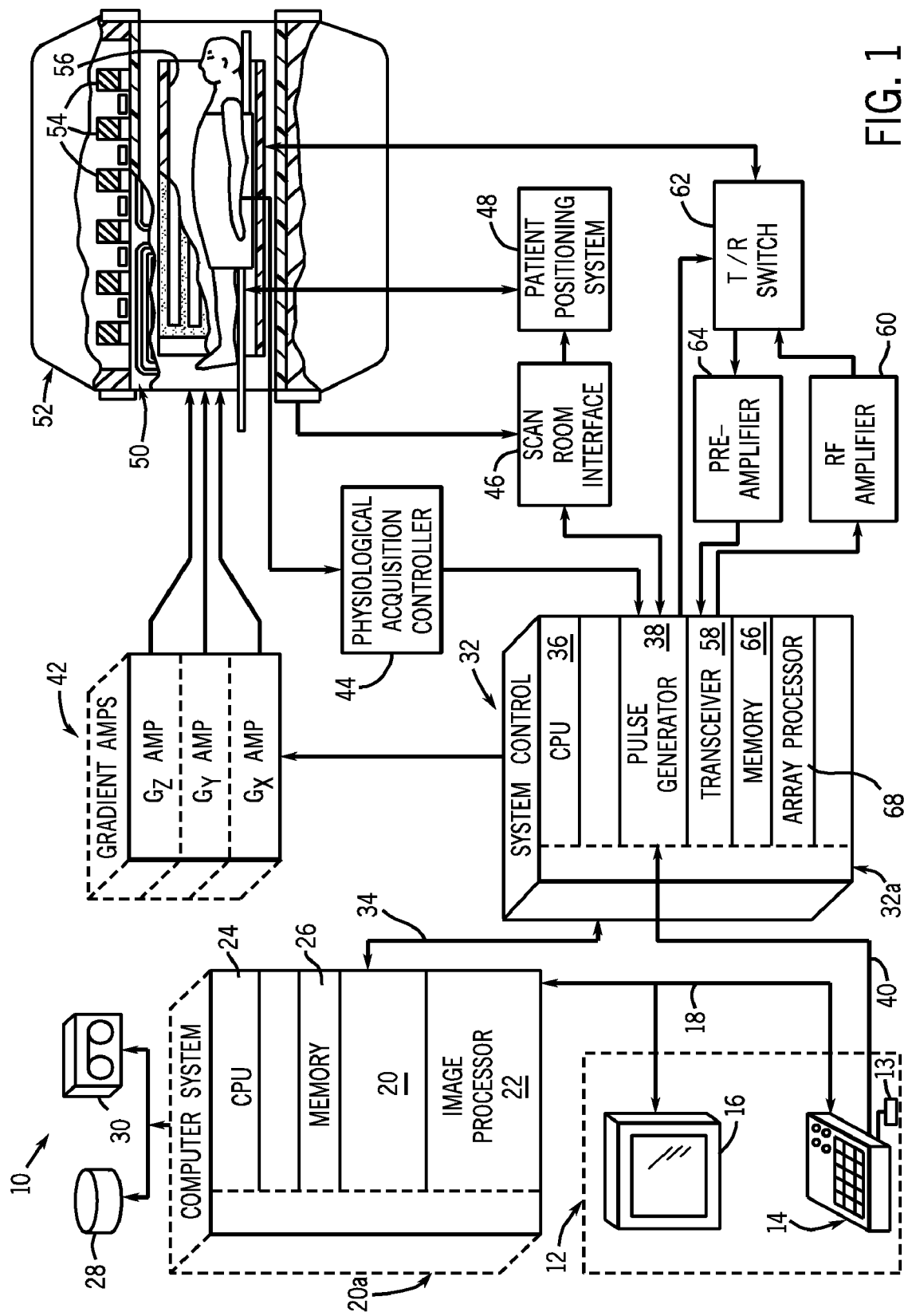
FIG. 1 is a schematic block diagram of an MR imaging system that can benefit from incorporation of the present invention.

Referring to FIG. 1, the major components of a preferred magnetic resonance imaging (MRI) system 10 benefiting from incorporating the present invention are shown. The operation of the system 10 is controlled from an operator console 12, which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The gradient coil assembly 50 typically has three sets of coils (not shown). Each set of gradient coils produces a gradient field in one of the x, y, or z directions. Each gradient field direction has a unique symmetry. That is, a gradient field produced in the x direction has a symmetry different than the symmetries produced by gradient fields in the y direction and in the z direction. Each of the directions of the gradient fields in the y direction and in the z direction has a symmetry different than the symmetries produced by gradient fields in the x and z directions and in the x and y directions, respectively. Additionally, the symmetries of the gradient field produced in the x, y, and z directions have different symmetries than the symmetry of the uniform magnetic field produced by the polarizing magnet 54.

Referring to FIGS. 2-9, cylindrical pairs of superconducting coils 70, 72 for producing a static uniform field in an MR system, such as the MR system 10 of FIG. 1, are shown. The direction of the gradient field at each superconducting coil 70, 72 can be mostly axial ($B_z$), mostly radial ($B_r$), or a combination of both ($B_{rz}$), depending on the position of the superconducting coils 70, 72. Based on the gradient field direction, a gradient shield loop 75 having a plurality of arcs 76 is locally wound along the superconducting coils 70, 72. The gradient field direction may be determined by measurement or calculation. Once the gradient field direction is known for the superconducting coil 70, 72 position, the gradient shield loop 75 may be wound along the superconducting coils 70, 72 such that the gradient field direction is substantially orthogonal to a plane formed between pairs of the plurality of arcs 76.

The gradient shield loop 75 is preferably a single superconducting wire or cable wound adjacent to the superconducting coils 70, 72 to form the plurality of arcs 76. The gradient shield loop 75 includes bifilar routing 78 to reduce magnetic lead coupling. A superconducting joint 79 connects a first end 80 of the gradient shield loop 75 to a second end 81 of the gradient shield loop 75 to form a closed superconducting loop. In a preferred embodiment, the gradient shield loop 75 is wound adjacent to the pair of superconducting coils 70, 72. However, it is contemplated that in the x and y gradient field directions, each superconducting coil 70, 72 may have a separate gradient shield loop 75 wound adjacent thereto to form a closed superconducting loop for each superconducting coil 70, 72. Alternatively, each of the plurality of arcs 76 may be wound via a separate superconducting wire connected in series at the superconducting joint 79.

The superconducting coils 70, 72 and gradient shield loop 75 are cooled via a superconducting cooling system (not shown). Superconductively cooling the gradient shield loop 75 allows the gradient shield loop 75 to substantially simultaneously magnetically couple with the gradient fields $G_x$, $G_y$, and $G_z$. That is, the gradient shield loop 75 operates in sync with one of the gradient fields $G_x$, $G_y$, and $G_z$. In this manner, generation of magnetic gradient fields simultaneously produces a shielding current and a shielding field in the gradient shield loop 75 via a magnetic flux linkage. The shielding field significantly reduces the AC field and AC losses in the superconducting coils 70, 72. Because the gradient shield loop 75 is wound in the same symmetry as its corresponding magnetic field gradient, the net magnetic flux generated thereby is not affected by other magnetic field gradients or by the polarizing magnet 54.

FIGS. 2-5 show a plurality of arcs 76 of a gradient shield loop 75 locally wound along portions of the superconducting coils 70, 72, which are exposed to gradient fields generated by the y-gradient, $G_y$. Local winding of the plurality of arcs 76 along portions of the superconducting coils 70, 72 exposed to gradient fields generated by the x-gradient, $G_x$, is similar to that shown in FIGS. 2-5 following a 90 degree rotation about a central axis 82.

Figure 2:
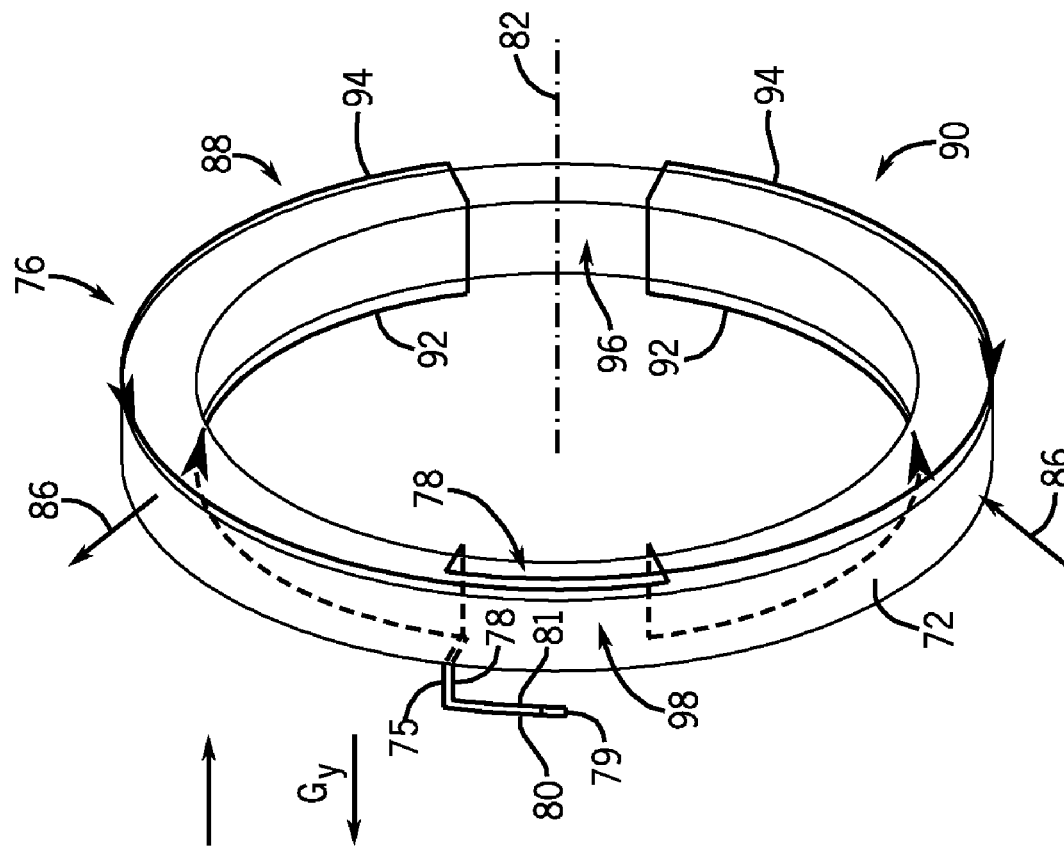
FIG. 2 is a perspective view of a local gradient shield loop for each of a pair of superconducting magnet coils exposed to a $B_{rz}$ field generated by y-gradient, $G_y$, in accordance with the present invention.
Figure 2:
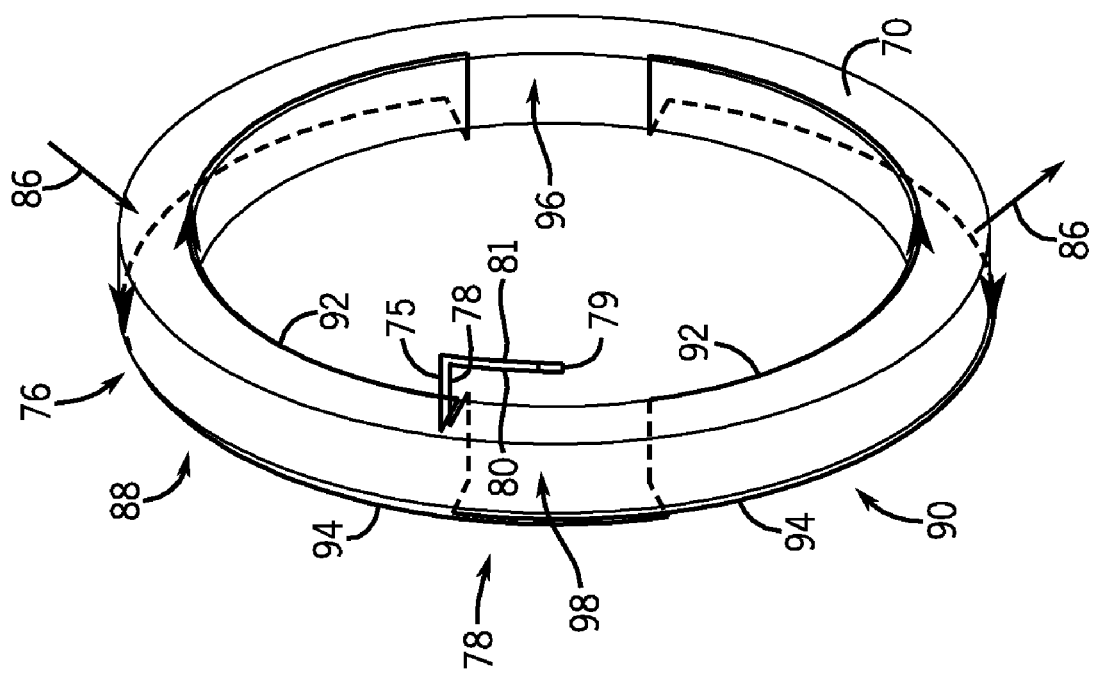
Figure 3:
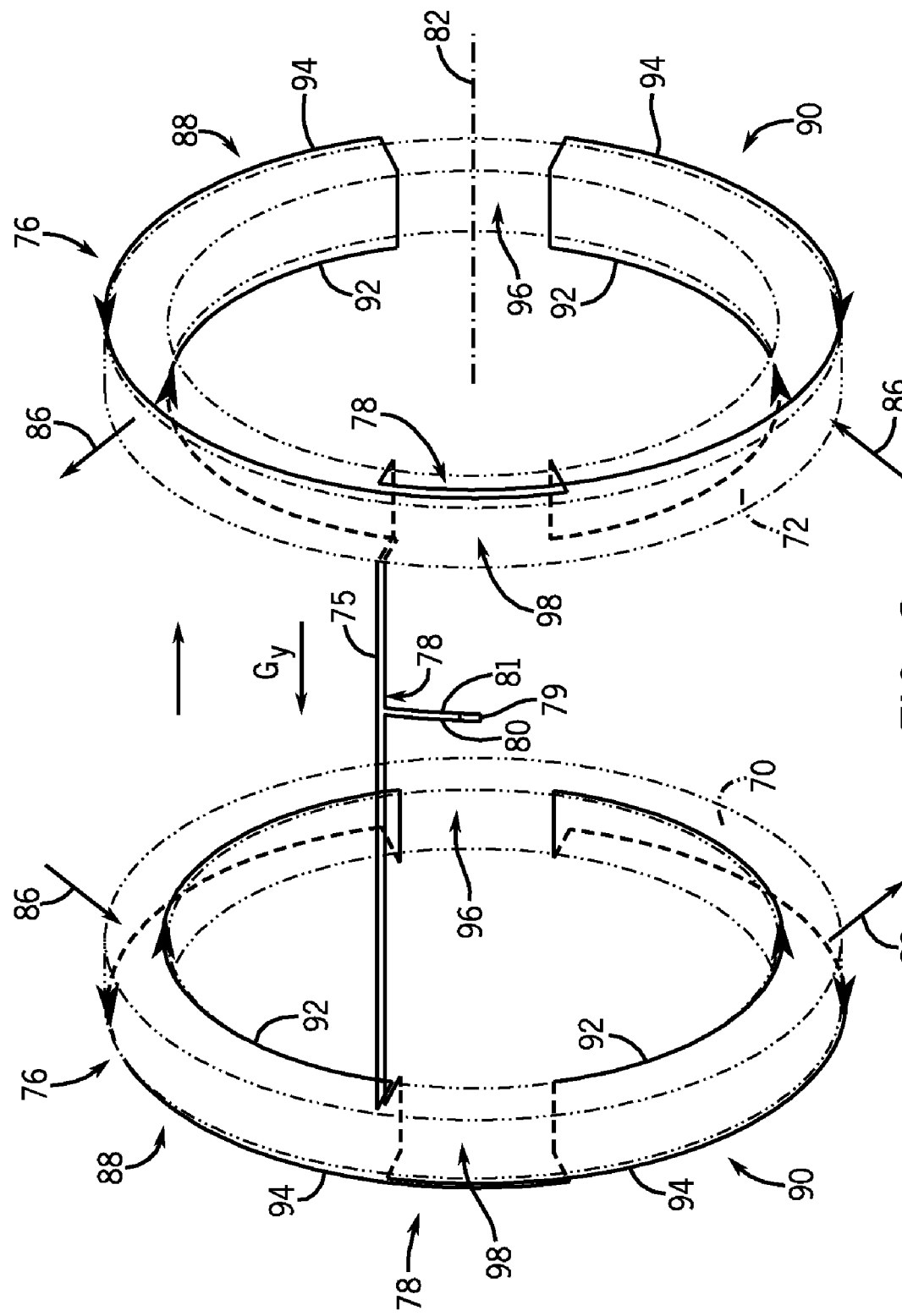
FIG. 3 is a perspective view of a local gradient shield loop for a pair of superconducting magnet coils exposed to a $B_{rz}$ field generated by y-gradient, $G_y$, in accordance with the present invention.

FIGS. 2-3 show local winding of a plurality of arcs 76 of a gradient shield loop 75 along portions of the superconducting coils 70, 72 exposed to a $B_{rz}$ gradient field direction 86 generated by y-gradients, $G_y$. Each superconducting coil 70, 72 includes two pairs of arcs 88, 90. Each pair of arcs 88, 90 includes arcs 92, 94 circumferentially wound along portions of an inner diameter 96 and an outer diameter 98, respectively, of the superconducting coils 70, 72. As shown in FIG. 2, each superconducting coil 70, 72 has a closed gradient shield loop 75 wound adjacent thereto. FIG. 3 shows a closed gradient shield loop 75 wound adjacent to the pair of superconducting coils 70, 72.

Figure 4:
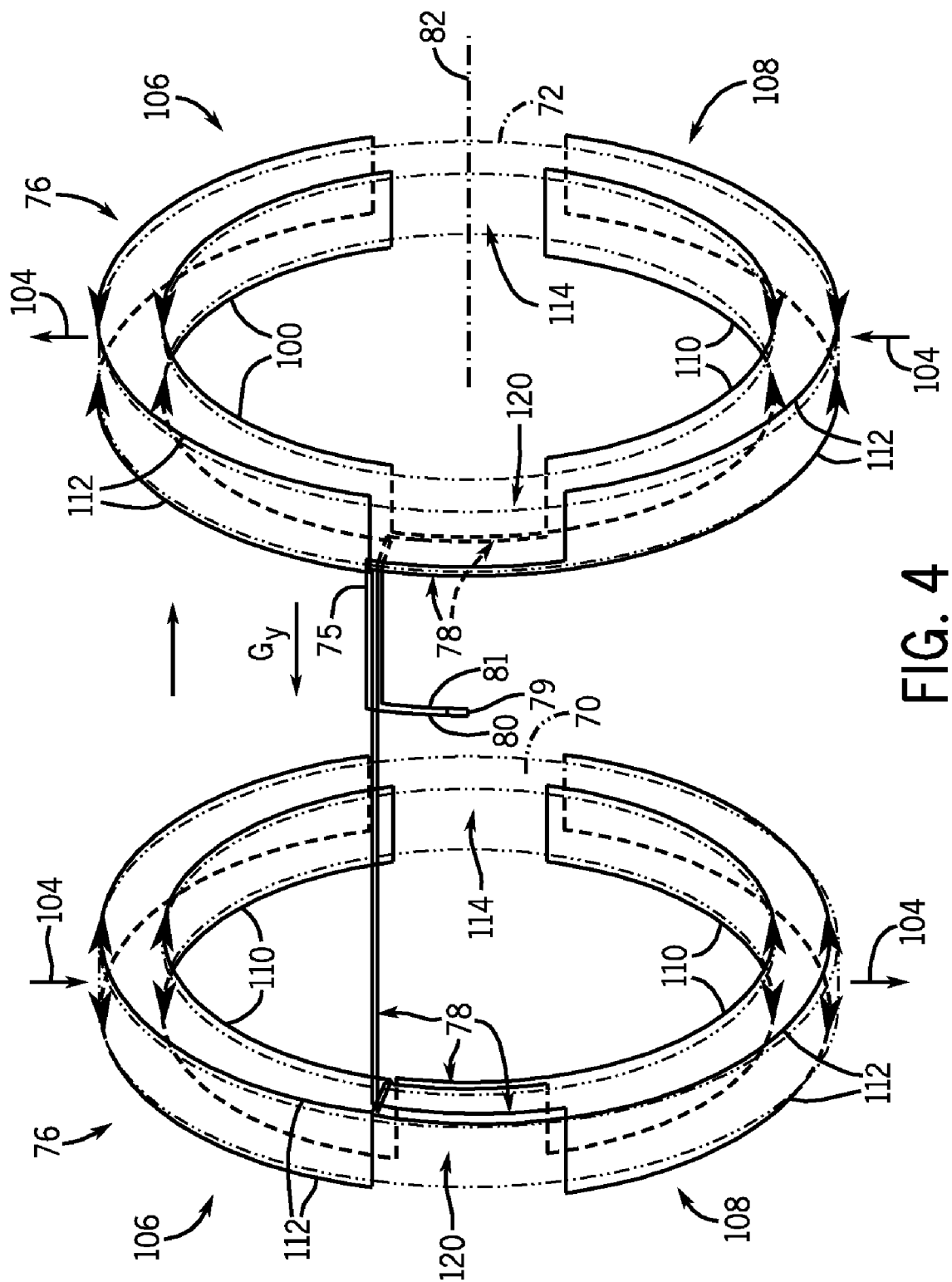
FIG. 4 is a perspective view of a local gradient shield loop for a pair of superconducting magnet coils exposed to a $B_r$ field generated by y-gradient, $G_y$, in accordance with the present invention.

FIG. 4 shows local winding of the plurality of arcs 76 of a gradient shield loop 75 along portions of the pair of superconducting coils 70, 72 exposed to a $B_r$ gradient field direction 104 generated by y-gradients, $G_y$. Each superconducting coil 70, 72 includes two sets of arcs 106, 108. Each set of arcs 106, 108 includes a pair of arcs 110, 112 circumferentially wound along portions of an inner diameter 114 of the superconducting coils 70, 72 and a pair of arcs 116, 118 circumferentially wound along portions of an outer diameter 120 of the superconducting coils 70, 72.

Figure 5:
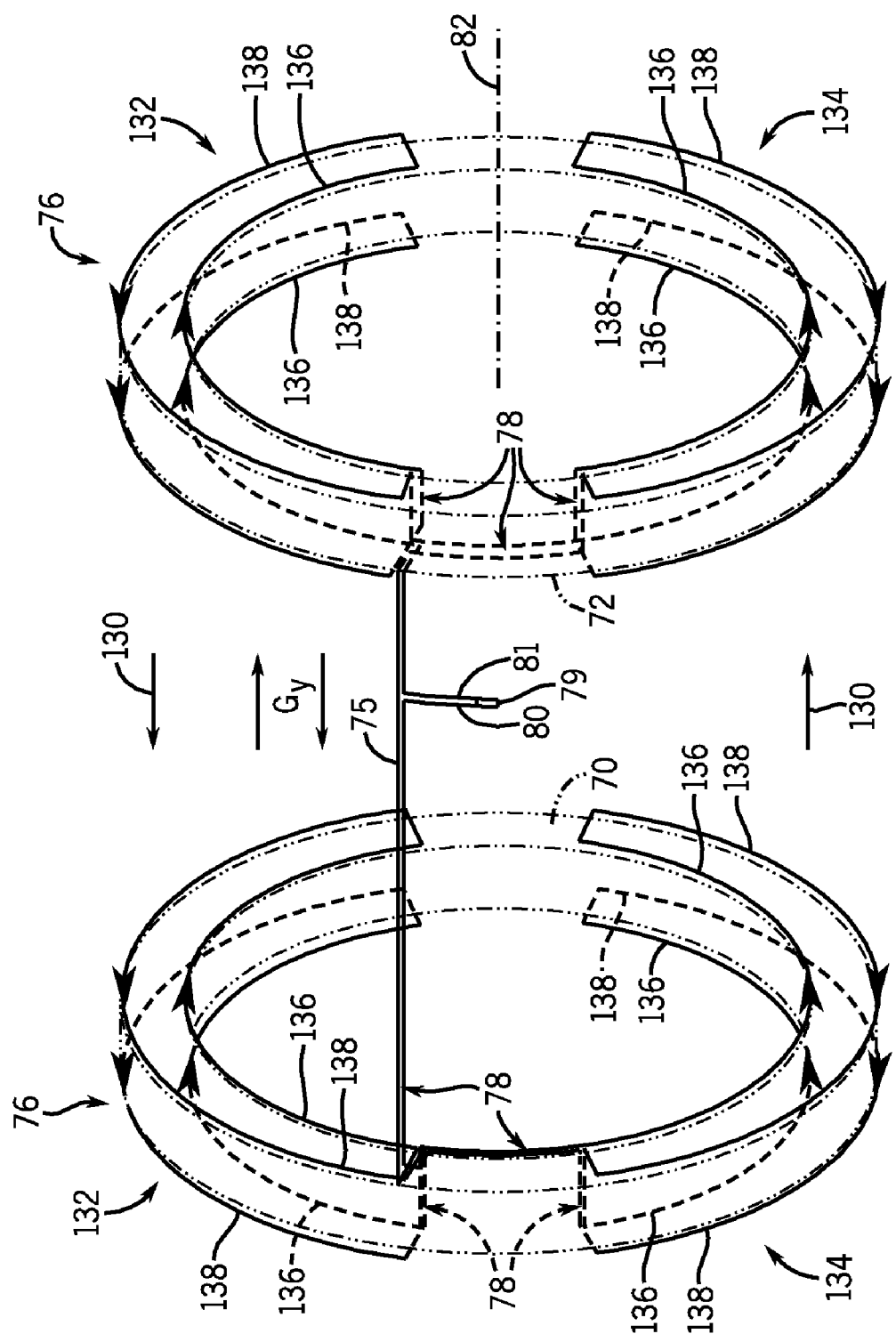
FIG. 5 is a perspective view of a local gradient shield loop for a pair of superconducting magnet coils exposed to a $B_z$ field generated by y-gradient, $G_y$, in accordance with the present invention.

FIG. 5 shows local winding of the plurality of arcs 76 of a gradient shield loop 75 along portions of the pair of superconducting coils 70, 72 exposed to a $B_z$ gradient field direction 130 generated by y-gradients, $G_y$. Each superconducting coil 70, 72 includes two sets of arcs 132, 134. Each set of arcs 132, 134 includes two pairs of arcs 136, 138 circumferentially wound along portions of an inner diameter 138 and an outer diameter 140, respectively, of the superconducting coils 70, 72.

Figure 6:
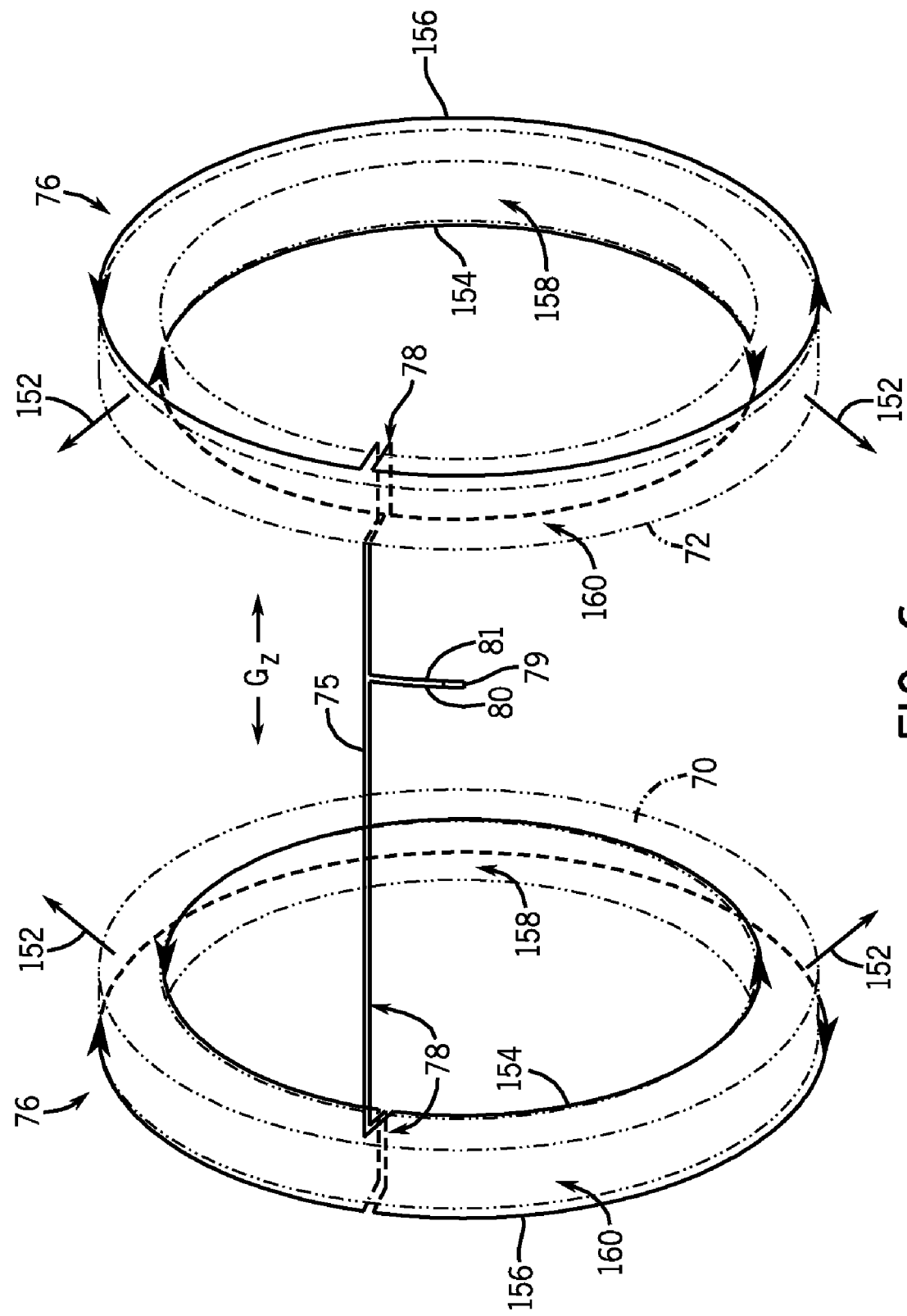
FIG. 6 is a perspective view of a local gradient shield loop for a pair of superconducting magnet coils exposed to a $B_{rz}$ field generated by z-gradient, $G_z$, in accordance with the present invention.
Figure 7:
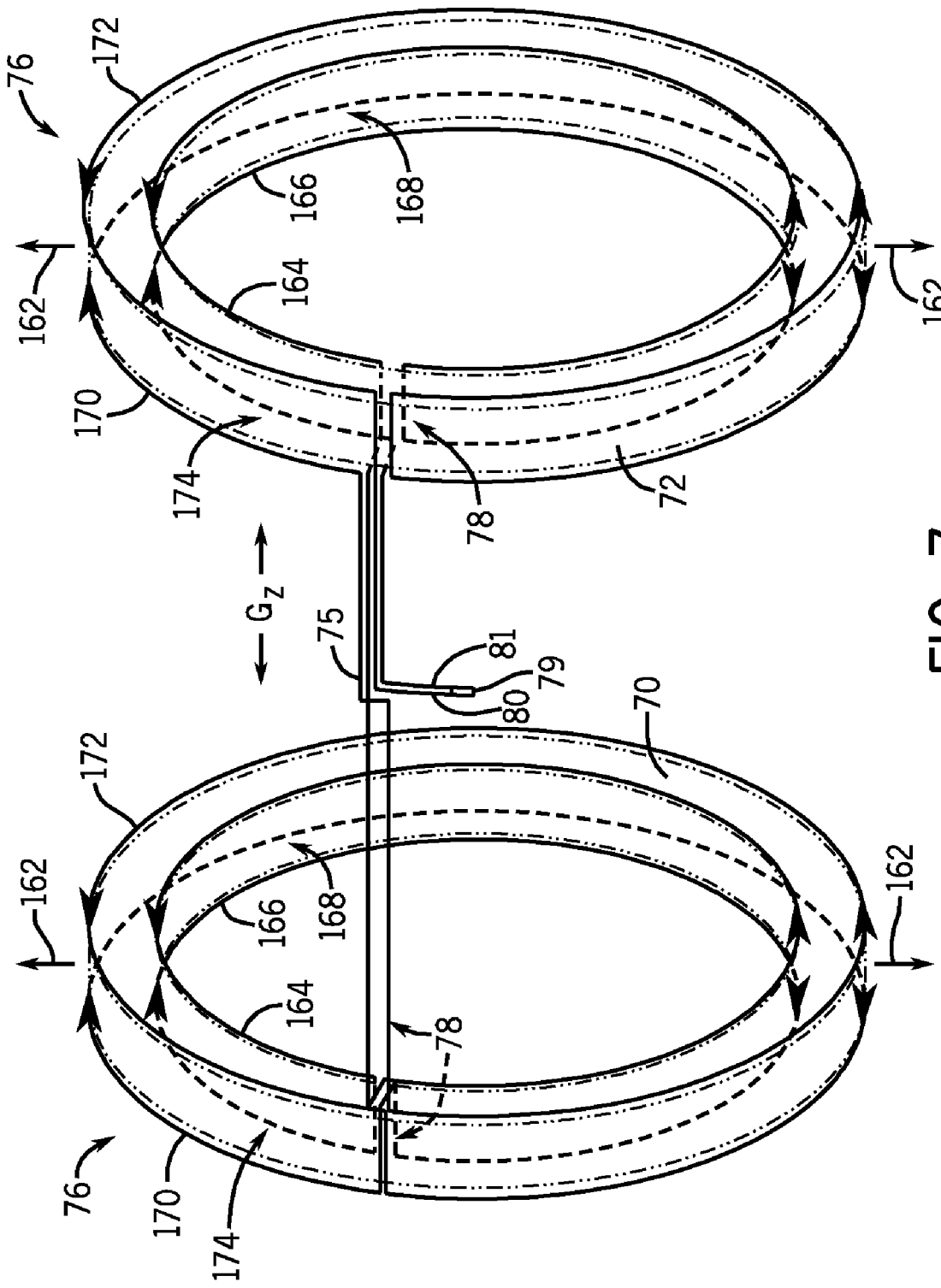
FIG. 7 is a perspective view of a local gradient shield loop for a pair of superconducting magnet coils exposed to a $B_{rz}$ field generated by z-gradient, $G_z$, in accordance with the present invention.
Figure 8:
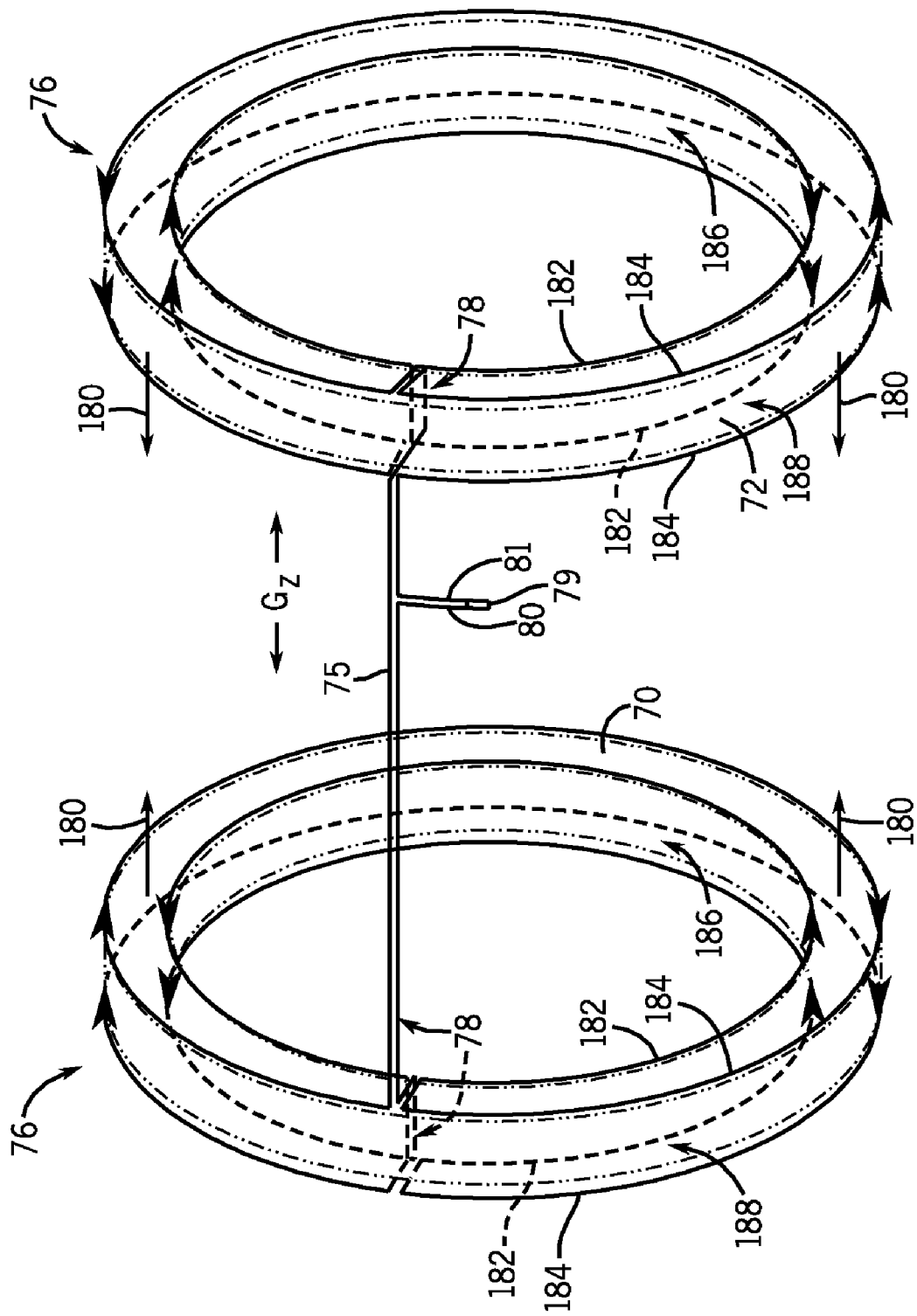
FIG. 8 is a perspective view of a local gradient shield loop for a pair of superconducting magnet coils exposed to a $B_{rz}$ field generated by z-gradient, $G_z$, in accordance with the present invention.

FIGS. 6-8 show a plurality of arcs 76 of a gradient shield loop 75 locally wound along portions of the superconducting coils 70, 72, which are exposed to gradient field directions generated by z-gradients, $G_z$.

FIG. 6 shows local winding of the plurality of arcs 76 of a gradient shield loop 75 along portions of the pair of superconducting coils 70, 72 exposed to a $B_{rz}$ gradient field direction 152 generated by z-gradients, $G_z$. Each superconducting coil 70, 72 includes a pair of arcs 154, 156 circumferentially wound along portions of an inner diameter 158 and an outer diameter 160, respectively, of the superconducting coils 70, 72.

FIG. 7 shows local winding of the plurality of arcs 76 of a gradient shield loop 75 along portions of the pair of superconducting coils 70, 72 exposed to a $B_r$ gradient field direction 162 generated by z-gradients, $G_z$. Each superconducting coil 70, 72 includes a pair of arcs 164, 166 circumferentially wound along portions of an inner diameter 168 of the superconducting coils 70, 72 and a pair of arcs 170, 172 circumferentially wound along portions of an outer diameter 174 of the superconducting coils 70, 72.

FIG. 8 shows local winding of the plurality of arcs 76 of a gradient shield loop 75 along portions of the pair of superconducting coils 70, 72 exposed to a $B_z$ gradient field direction 180 generated by z-gradients, $G_z$. Each superconducting coil 70, 72 includes two pairs of arcs 182, 184 circumferentially wound along portions of an inner diameter 186 and an outer diameter 188, respectively, of the superconducting coils 70, 72.

Figure 9:
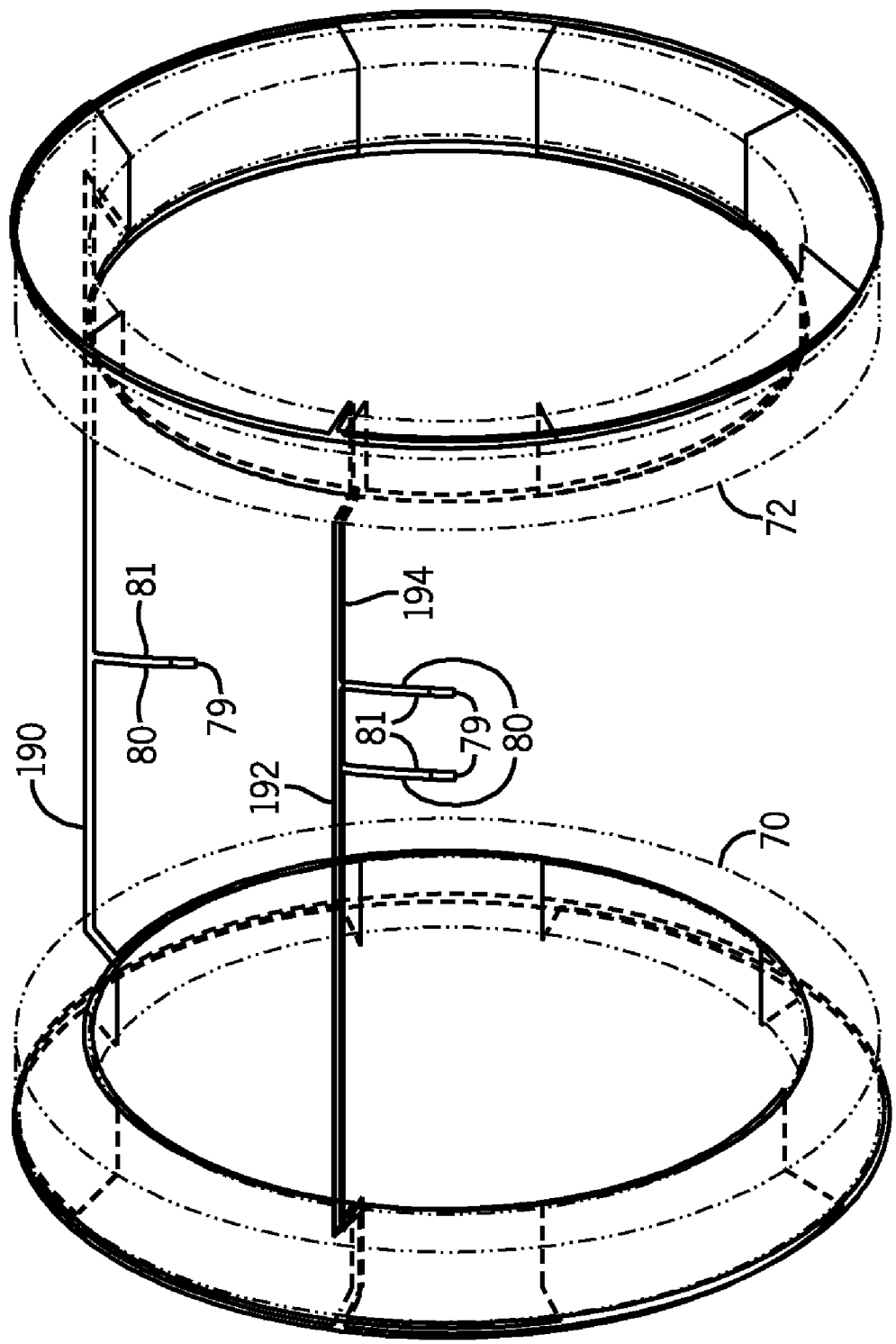
FIG. 9 is a perspective view of a set of local gradient shield loops for a pair of superconducting magnet coils exposed to a $B_{rz}$ field generated by an x-gradient, $G_x$, a y-gradient, $G_y$, and a z-gradient, $G_z$, in accordance with the present invention.

To locally shield superconducting coils 70, 72 from magnetic field gradients in each of the x, y, and z directions, the pair of superconducting coils 70, 72 have a plurality of gradient shield loops 190, 192, 194 wound therearound as shown in FIG. 9. Preferably, a direction of the magnetic gradient field acting on the superconducting coils 70, 72 is independently determined for each of the $G_x$, $G_y$, $G_z$ magnetic field gradients. When the magnetic gradient field direction acting on each of the superconducting coils 70, 72 is determined, each gradient shield loop 190, 192, 194 may be wound around the pair of superconducting coils 70, 72 as described above so as to correspond to the magnetic gradient field direction for a respective magnetic gradient field. As shown in FIG. 9, the plurality of gradient shield loops 190, 192, 194 locally shield the pair of superconducting coils 70, 72 from a $B_{rz}$ gradient field direction generated by each of the $G_x$, $G_y$, $G_z$ magnetic field gradients.

Wrapping a plurality of gradient shield loops about superconducting magnet coils of a polarizing magnet of an MR system in the manner described above produces shielding fields local to the superconducting magnet coils. Local shielding of the superconducting magnet coils reduces impact of gradient shielding fields in the imaging volume. As such, the impact of gradient shielding fields on the magnetic gradient fields used for spatially encoding acquired signals is reduced, and gradient system performance may be increased.

Therefore, a shielding coil apparatus is disclosed and includes a superconducting wire forming a closed conductive path and having a plurality of arcs positioned along portions of a first superconducting magnet coil of an MR system, the plurality of arcs configured to magnetically couple with a gradient magnetic field generated by a magnetic field gradient of a first direction to locally shield the first superconducting magnet coil.

An MRI apparatus is also presented and includes a magnetic resonance imaging system having a plurality of gradient coils positioned about a bore of a superconducting magnet to impress a polarizing magnetic field and an RF transceiver system and an RF switch controlled by a pulse module to transmit RF signals to an RF coil assembly to acquire MR images, wherein the superconducting magnet comprises a plurality of superconducting magnet coils. The MRI apparatus also includes a first gradient shielding loop routed proximate to each superconducting magnet coil and configured to couple with a magnetic field gradient, the magnetic field gradient comprising one of a $G_x$ magnetic field gradient, a $G_y$ magnetic field gradient, and a $G_z$ magnetic field gradient.

The present invention is also embodied in a method that includes forming a superconducting magnet coil and routing a first plurality of arc portions of a first gradient shield coil adjacent to the coil, the first plurality of arc portions configured to couple with a first magnetic field gradient.

The present invention has been described in terms of the preferred embodiment, and it is recognized that equivalents, alternatives, and modifications, aside from those expressly stated, are possible and within the scope of the appending claims.

What is claimed is:

1. A shielding coil apparatus comprising:
a superconducting wire wound along a first superconducting magnet coil of a magnetic resonance (MR) system forming a closed conductive path and having a plurality of arcs positioned along portions of said first superconducting magnet coil, the plurality of arcs configured to magnetically couple with a gradient magnetic field generated by a magnetic field gradient of a first direction to locally shield the first superconducting magnet coil.

2. The shielding coil apparatus of claim 1 further comprising a first arc of the plurality of arcs circumferentially wound along an outer diameter of the first superconducting magnet coil.

3. The shielding coil apparatus of claim 2 further comprising a second arc of the plurality of arcs circumferentially wound along an inner diameter of the first superconducting magnet coil.

4. The shielding coil apparatus of claim 3 wherein a plane defined between the first and second arcs is substantially orthogonal to a $B_{rz}$ gradient field direction.

5. The shielding coil apparatus of claim 3 further comprising:
a third arc of the plurality of arcs circumferentially wound along the outer diameter of the first superconducting magnet coil; and
a fourth arc of the plurality of arcs circumferentially wound along the inner diameter of the first superconducting magnet coil.

6. The shielding coil apparatus of claim 5 further comprising:
a fifth arc of the plurality of arcs circumferentially wound along the outer diameter of the first superconducting magnet coil; and
a sixth arc of the plurality of arcs circumferentially wound along the outer diameter of the first superconducting magnet coil;
a seventh arc of the plurality of arcs circumferentially wound along the inner diameter of the first superconducting magnet coil; and
a eighth arc of the plurality of arcs circumferentially wound along the inner diameter of the first superconducting magnet coil.

7. The shielding coil apparatus of claim 5 wherein a plane defined between the first and third arcs is substantially orthogonal to a $B_r$ gradient field direction.

8. The shielding coil apparatus of claim 5 wherein a plane defined between the first and fourth arcs is substantially orthogonal to a $B_z$ gradient field direction.

9. The shielding coil apparatus of claim 1 further comprising a superconducting joint configured to connect a first end of the superconducting wire to a second end thereof.

10. The shielding coil apparatus of claim 1 wherein the first direction is one of an x direction, a y direction, and a z direction.

11. The shielding coil apparatus of claim 10 further comprising:
a second superconducting wire positioned along portions of the first superconducting magnet coil and having a plurality of arcs configured to magnetically couple with a gradient magnetic field generated by a magnetic field gradient of a second direction, wherein the second direction is orthogonal to the first direction in one of the x direction, the y direction, and the z direction; and
a third superconducting wire positioned along portions of the first superconducting magnet coil and having a plurality of arcs configured to magnetically couple with a gradient magnetic field generated by a magnetic field gradient of a third direction, wherein the third direction is orthogonal to the first direction and the second direction in one of the x direction, the y direction, and the z direction.

12. The shielding coil apparatus of claim 1 wherein the superconducting wire has a second plurality of arcs positioned along portions of a second superconducting magnet coil of an MR system, the second plurality of arcs configured to magnetically couple with the gradient magnetic field generated by the magnetic field gradient of the first direction to locally shield the second superconducting magnet coil.

13. An MRI apparatus comprising:
a magnetic resonance imaging (MRI) system having a plurality of gradient coils positioned about a bore of a superconducting magnet to impress a polarizing magnetic field and an RF transceiver system and an RF switch controlled by a pulse module to transmit RF signals to an RF coil assembly to acquire MR images, wherein the superconducting magnet comprises a plurality of superconducting magnet coils; and
a first gradient shielding loop wound along each superconducting magnet coil and configured to couple with a magnetic field gradient, the magnetic field gradient comprising one of a $G_x$ magnetic field gradient, a $G_y$ magnetic field gradient, and a $G_z$ magnetic field gradient.

14. The MRI apparatus of claim 13 wherein the first gradient shielding loop comprises sets of arc sections, and wherein a plane defined by each set of arc sections is configured to be substantially orthogonal to a gradient field direction of the magnetic field gradient coupled with the first gradient shielding loop.

15. The MRI apparatus of claim 14 further comprising two sets of arc sections wound along each superconducting magnet coil.

16. The MRI apparatus of claim 14 further comprising four sets of arc sections wound along each superconducting magnet coil.

17. The MRI apparatus of claim 13 further comprising a superconducting joint connecting one end of the first gradient shielding loop to another end thereof.

18. The MRI apparatus of claim 13 further comprising:
a second gradient shielding loop wound along each superconducting magnet coil and configured to couple with a magnetic field gradient orthogonal to the magnetic field gradient coupled with the first gradient shielding loop; and
a third gradient shielding loop wound along each superconducting magnet coil and configured to couple with a magnetic field gradient orthogonal to the magnetic field gradient coupled with the first gradient shielding loop and orthogonal to the magnetic field gradient coupled with the second gradient shielding loop.

19. A method comprising the steps of:
forming a coil of a superconducting magnet; and
routing a first plurality of arc portions of a first gradient shield coil along the coil, the first plurality of arc portions configured to couple with a first magnetic field gradient to locally shield the first superconducting magnet coil.

20. The method of claim 19 further comprising the step of determining a direction of a gradient field generated by the first magnetic field gradient acting upon the coil.

21. The method of claim 20 wherein the step of determining the direction of the gradient field comprises measuring the direction of the gradient field.

22. The method of claim 20 wherein the step of determining the direction of the gradient field comprises calculating the direction of the gradient field.

23. The method of claim 19 wherein the step of routing the first plurality of arc portions comprises routing a first arc portion along an inner diameter of the coil and routing a second arc portion along an outer diameter of the coil.

24. The method of claim 23 wherein the step of routing the first plurality of arc portions comprises routing a third arc portion along the inner diameter of the coil and routing a fourth arc portion along the outer diameter of the coil.

25. The method of claim 19 further comprising the step of connecting a first end and a second end of the first gradient shield coil together via a superconducting joint.

26. The method of claim 19 further comprising the steps of:
routing a plurality of arc portions of a second gradient shield coil along the coil, the plurality of arc portions configured to couple with a second magnetic field gradient orthogonal to the first magnetic field gradient;
routing a plurality of arc portions of a third gradient shield coil along the coil, the plurality of arc portions configured to couple with a third magnetic field gradient orthogonal to the first and second magnetic field gradients.

27. The method of claim 19 further comprising the steps of:
forming another coil of the superconducting magnet;
routing a second plurality of arc portions of the first gradient shield coil along the another coil, the second plurality of arc portions configured to couple with the first magnetic field gradient.

* * * * *